(12) United States Patent
Kirikihira et al.

(10) Patent No.: US 11,006,521 B2
(45) Date of Patent: May 11, 2021

(54) WIRING BASE PLATE, ELECTRONIC DEVICE PACKAGE, AND ELECTRONIC DEVICE

(71) Applicant: KYOCERA Corporation, Kyoto (JP)

(72) Inventors: Isamu Kirikihira, Kirishima (JP); Makoto Yamamoto, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 22 days.

(21) Appl. No.: 16/487,864

(22) PCT Filed: Jan. 24, 2018

(86) PCT No.: PCT/JP2018/002148
§ 371 (c)(1),
(2) Date: Aug. 22, 2019

(87) PCT Pub. No.: WO2018/155053
PCT Pub. Date: Aug. 30, 2018

(65) Prior Publication Data
US 2020/0253045 A1    Aug. 6, 2020

(30) Foreign Application Priority Data

Feb. 23, 2017    (JP) .............................. JP2017-031937

(51) Int. Cl.
*H05K 1/03*    (2006.01)
*H05K 1/09*    (2006.01)
(Continued)

(52) U.S. Cl.
CPC ............. *H05K 1/0306* (2013.01); *H01B 3/12* (2013.01); *H05K 1/09* (2013.01); *H05K 5/0069* (2013.01)

(58) Field of Classification Search
CPC .......... H05K 1/03; H05K 1/0306; H05K 1/09; H05K 3/00; H05K 3/28; H05K 3/285; H05K 3/38; H05K 3/0052; B01D 39/20; B01D 39/2027; B01D 39/2051; B01D 39/2058; B01D 39/2093; B01D 67/0041;
(Continued)

(56) References Cited

U.S. PATENT DOCUMENTS 5,104,540 A * 4/1992 Day .................... B01D 39/2027
                                                         210/510.1
5,376,442 A * 12/1994 Davidson ........... B01D 67/0048
                                                         428/307.7
(Continued)

FOREIGN PATENT DOCUMENTS

JP    2002-029834 A    1/2002
JP    2010-177334 A    8/2010

*Primary Examiner* — Xiaoliang Chen
(74) *Attorney, Agent, or Firm* — Volpe Koenig (57) ABSTRACT

Provided are a wiring base plate and the like including an insulating substrate including a first surface portion including an aluminum oxide-based sintered body and a mullite-based sintered body; and a metallization layer including a second surface portion, the second surface portion containing at least one of a manganese compound and a molybdenum compound and being in contact with the first surface portion of the insulating substrate; wherein the second surface portion of the metallization layer and the first surface portion of the insulating substrate contain at least one of a manganese silicate phase and a magnesium silicate phase.

14 Claims, 3 Drawing Sheets

(51) Int. Cl.
  *H05K 3/00* (2006.01)
  *H05K 3/28* (2006.01)
  *H05K 3/38* (2006.01)
  *B01D 39/20* (2006.01)
  *B01D 71/00* (2006.01)
  *B01D 71/02* (2006.01)
  *H01L 23/12* (2006.01)
  *H01L 23/13* (2006.01)
  *H01B 3/12* (2006.01)
  *H05K 5/00* (2006.01)

(58) Field of Classification Search
  CPC ............ B01D 67/0046; B01D 67/0048; B01D 71/00; B01D 71/02; H01L 23/12; H01L 23/13
  USPC ............... 361/760; 210/321.83, 487, 500.25, 210/510.1; 428/43, 307.7, 312.8; 324/756.03; 501/127
  See application file for complete search history.

(56) References Cited

U.S. PATENT DOCUMENTS

| | | | |
|---|---|---|---|
| 5,605,628 A * | 2/1997 | Davidson | B01D 67/0041 210/321.83 |
| 2002/0030573 A1 | 3/2002 | Mori et al. | |
| 2013/0078408 A1* | 3/2013 | Niino | H05K 3/0052 428/43 |
| 2013/0176048 A1* | 7/2013 | Furukubo | H05K 3/4629 324/756.03 |

\* cited by examiner

WIRING BASE PLATE, ELECTRONIC DEVICE PACKAGE, AND ELECTRONIC DEVICE

TECHNICAL FIELD

The present invention relates to a wiring base plate, an electronic device package, and an electronic device including an insulating substrate made from a ceramic material and a metallization layer bonded to the insulating substrate.

BACKGROUND ART

As a base plate used for mounting an electronic component or the like, there is known a base plate including an insulating substrate made from an insulating material such as an aluminum oxide-based sintered body, and a metallization layer provided on a surface of the insulating substrate. The metallization layer functions as a conducting path for electrical connection between an electronic component and an external electrical circuit. Furthermore, a metal member may be bonded to the metallization layer for improving heat radiating properties from the electronic component to the outside, and the like.

An electronic device including the electronic component mounted on the base plate is used as a component in an electronic equipment such as a smartphone and a tablet. Higher density and higher frequency are promoted in such an electronic device. Furthermore, as downsizing proceeds, there is also a demand for improved mechanical strength. To meet such a demand, there is proposed a technology in which a material including aluminum oxide and including a magnesium compound or the like added as a sintering aid is used as an insulating substrate (see Japanese Unexamined Patent Application Publication No. 2010-177334; Patent Document 1, Japanese Unexamined Patent Application Publication No. 2002-029834; Patent Document 2).

SUMMARY OF INVENTION

A metallized base plate according to one aspect of the present invention includes an insulating substrate including a first surface portion including an aluminum oxide-based sintered body and a mullite-based sintered body, and a metallization layer including a second surface portion containing at least one of a manganese compound and a molybdenum compound and being in contact with the first surface portion of the insulating substrate. The second surface portion of the metallization layer and the first surface portion of the insulating substrate contain at least one of a manganese silicate phase and a magnesium silicate phase.

An electronic device package according to one aspect of the present invention includes the wiring base plate including the configuration described above and a metal housing including a recessed portion. The insulating substrate is bonded to an inner surface of a recessed portion of the metal housing via the metallization layer.

An electronic device according to one aspect of the present invention includes the electronic device package including the configuration described above, and an electronic component housed within a recessed portion of the metal housing.

DESCRIPTION OF EMBODIMENTS

A wiring base plate, an electronic device package, and an electronic device according to an embodiment of the present invention will be described with reference to the accompanying drawings. Note that a distinction between top/upper and bottom/lower in the following description is only for the convenience of explanation, and does not limit how a wiring base plate, an electronic device package, or an electronic device is positioned vertically in actual use.

Figure 1A:
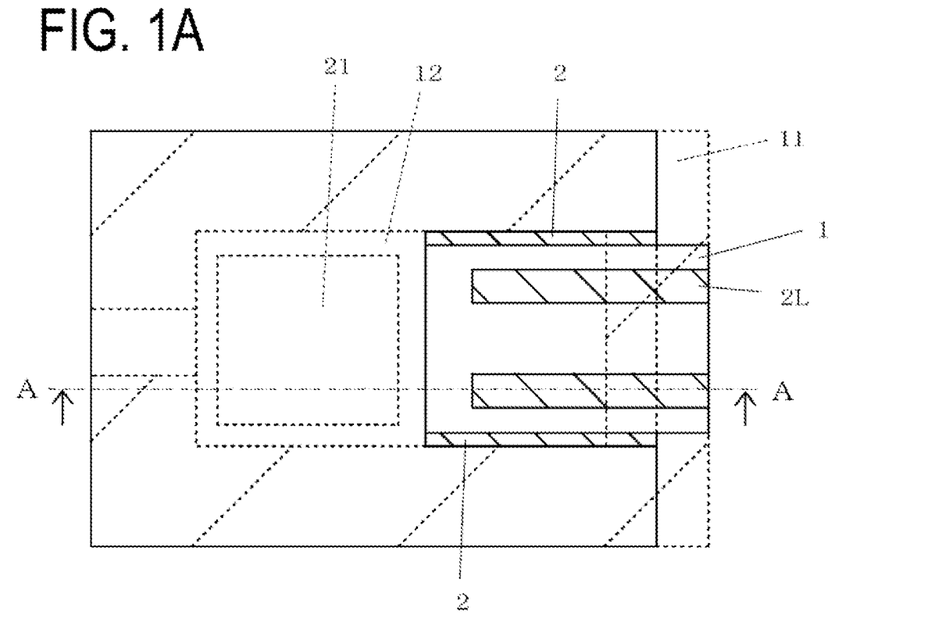
FIG. 1A is a plan view illustrating an example of a wiring base plate according to an embodiment of the present invention.
Figure 1B:
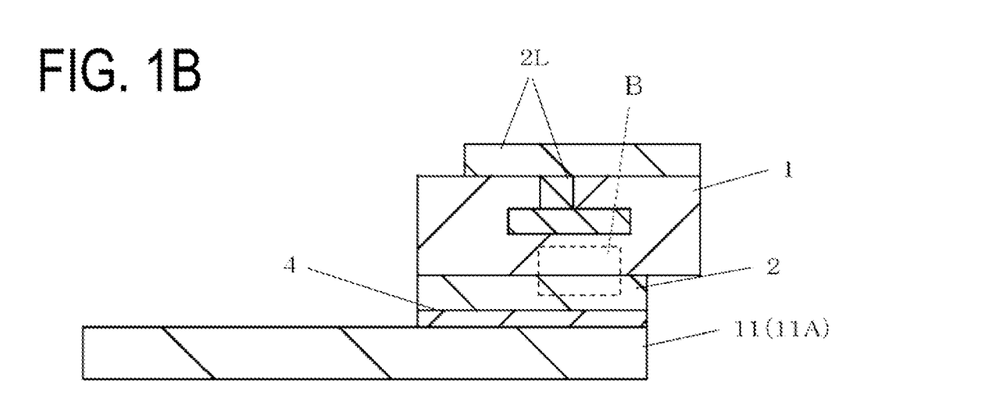
FIG. 1B is a cross-sectional view of FIG. 1A taken along line A-A.
Figure 2:
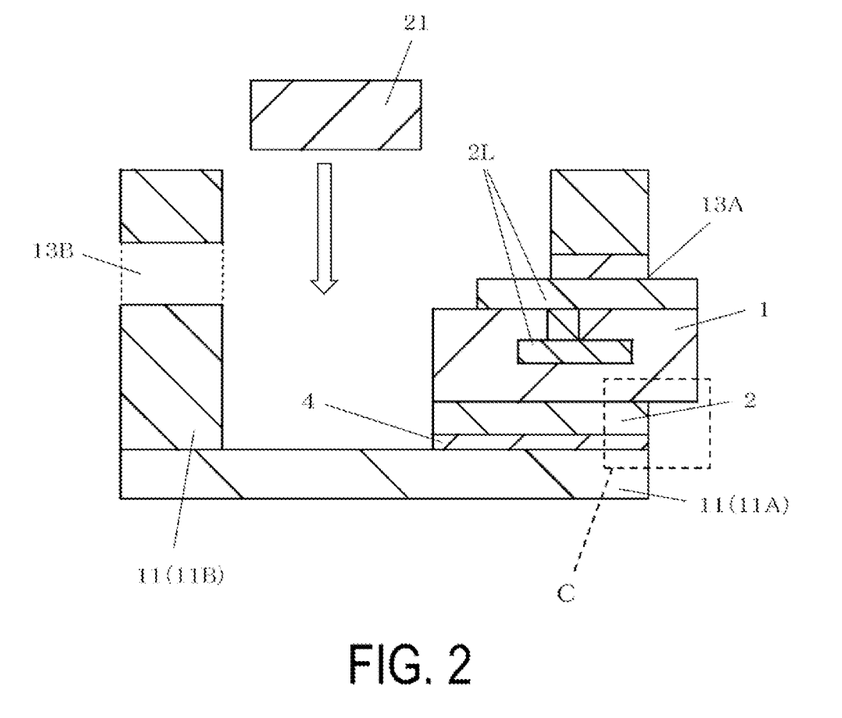
FIG. 2 is a cross-sectional view illustrating an example of an electronic device package according to an embodiment of the present invention.
Figure 3:
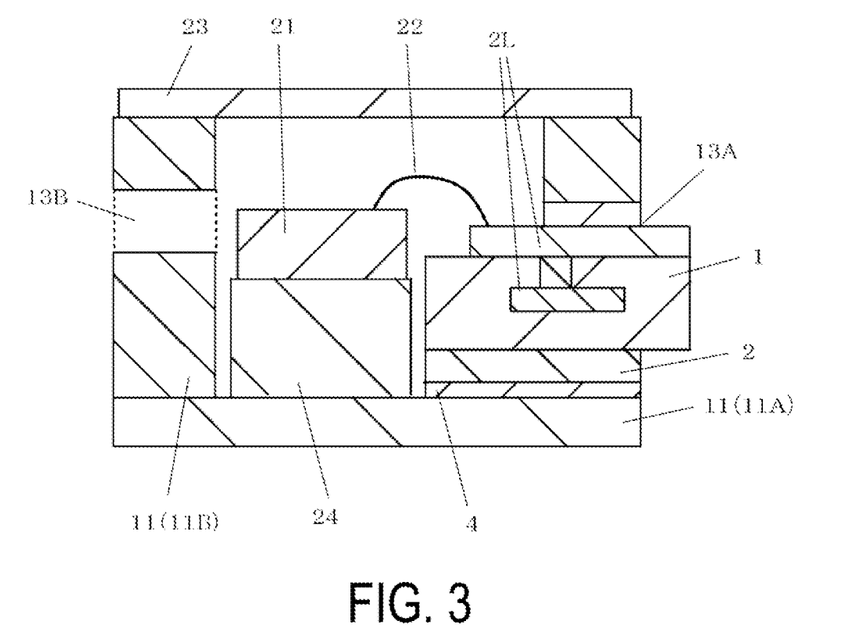
FIG. 3 is a cross-sectional view illustrating an example of an electronic device according to an embodiment of the present invention.
Figure 4:
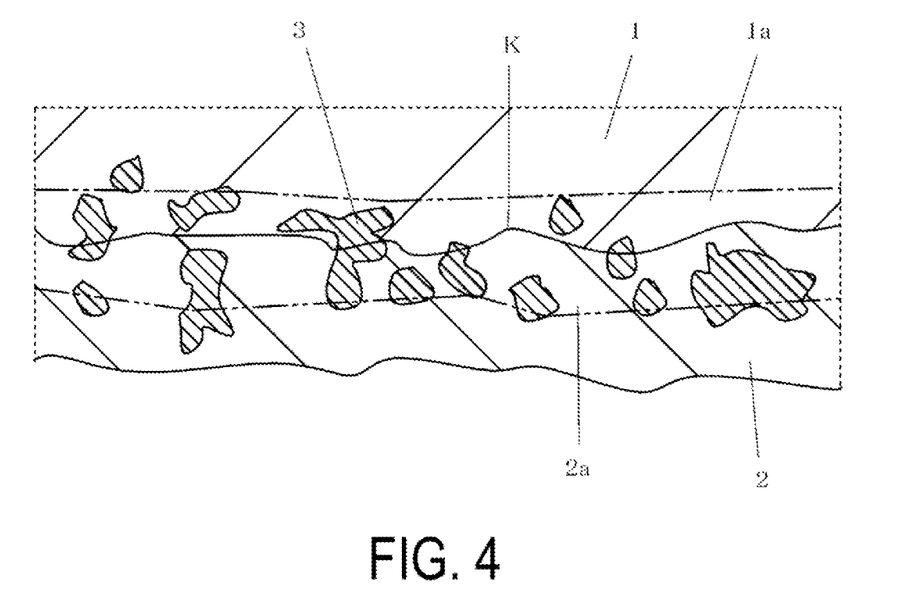
FIG. 4 is an enlarged cross-sectional view illustrating part B of FIG. 1B.

FIG. 1A is a plan view illustrating an example of a wiring base plate according to an embodiment of the present invention, and FIG. 1B is a cross-sectional view of FIG. 1A taken along line A-A. FIG. 2 is a cross-sectional view illustrating an example of an electronic device package according to an embodiment of the present invention. FIG. 3 is a cross-sectional view illustrating an example of an electronic device according to an embodiment of the present invention. FIG. 4 is an enlarged cross-sectional view illustrating part B of the wiring base plate illustrated in FIG. 1B. Note that FIG. 1A is not a cross-sectional view, but is partially hatched to facilitate differentiation. Furthermore, a portion of elements that are not provided in the wiring base plate but that are provided in the electronic device package or the electronic device are indicated by broken lines.

A wiring base plate 10 according to an embodiment basically includes an insulating substrate 1 and a metallization layer 2 being in contact with the insulating substrate 1. Furthermore, an electronic device package 20 according to an embodiment basically includes the wiring base plate 10 according to the embodiment and a metal housing 11 including a recessed portion 12, and the electronic device package 20 includes a configuration in which the insulating substrate 1 is bonded to an inner surface of the recessed portion 12 of the metal housing 11 via the metallization layer 2. Furthermore, an electronic device 30 according to an embodiment basically includes the electronic device package 20 according to the embodiment and an electronic component 21 housed within the recessed portion 12 of the metal housing 11. The electronic component 21 housed is electrically connected to the outside via a portion of the metallization layer 2, for example. Details of the wiring base plate 10, the electronic device package 20, and the electronic device 30 will be described below.

Wiring Base Plate

The insulating substrate 1 constituting the wiring base plate 10 is, for example in a plan view, a plate member having a rectangular shape and includes an upper surface, a lower surface, and a side surface. The insulating substrate 1 functions as a substrate for disposing a plurality of the metallization layers 2, for example.

The insulating substrate 1 includes a first surface portion 1a including an aluminum oxide-based sintered body and a mullite-based sintered body. The first surface portion 1a of the wiring base plate 10 is a portion of a surface of the insulating substrate 1 that is in contact with the metallization layer 2. In the wiring base plate 10 of this embodiment, the metallization layer 2 is in contact with the lower surface and the side surface of the insulating substrate 1. That is, a portion of the insulating substrate 1 bonded to the metallization layer 2 on the lower surface and the side surface of the insulating substrate 1 is the first surface portion 1a.

Note that the entirety of the insulating substrate 1 may be made from a ceramic sintered body including an aluminum oxide-based sintered body and a mullite-based sintered body. In this case, the insulating substrate 1 may be formed by laminating a plurality of insulating layers (not illustrated) made from an aluminum-based sintered body and a mullite-based sintered body.

Such an insulating substrate 1 can be fabricated as follows, for example. That is, raw material powder of aluminum oxide and mullite is kneaded with an appropriate additive, an organic binder, and an organic solvent to produce a slurry. This slurry is formed into a sheet shape by a doctor blade method or the like to produce a plurality of ceramic green sheets having a square sheet shape. Next, these ceramic green sheets are laminated to produce a laminate. Then, the insulating substrate 1 can be fabricated by subjecting this laminate to firing at a temperature of 1300 to 1600° C. As the additives described above, silica (silicon oxide), manganese oxide, molybdenum oxide, magnesium carbonate, and the like can be used.

The lower surface of the insulating substrate 1 may be the only surface including the first surface portion 1a that is in contact with the metallization layer 2. In this case, an insulating layer including an aluminum oxide-based sintered body and a mullite-based sintered body may be formed at least as a bottommost layer of the plurality of insulating layers forming the insulating substrate 1. Other insulating layers may be layers made from, for example, an aluminum oxide-based sintered body. The insulating layer including the aluminum oxide-based sintered body and the mullite-based sintered body, and the other insulating layers can be bonded to each other by a bonding method using, for example, a bonding material such as a brazing material and glass (this form is not illustrated).

The metallization layer 2 functions as a metal brazing layer, for example, for bonding various metal members that will be described later. Furthermore, the metallization layer 2 can also function as a conducting path for electrically connecting the electronic component 21 and an external electrical circuit, as described above. In FIGS. 1A and 1B and the figures referred to below, the metallization layer 2 as a conducting path is illustrated as other metallization layer 2L. The other metallization layer 2L is also in contact with the first surface portion 1a on the surface of the insulating substrate 1.

In the wiring base plate 10 according to the embodiment, the metallization layer 2 is in contact with and is bonded to the lower surface and the side surface of the insulating substrate 1. This metallization layer 2 contains at least one of a manganese compound and a molybdenum compound, and contains silica. Examples of the manganese compound and the molybdenum compound include oxides or silicates of manganese and molybdenum, respectively.

Furthermore, the metallization layer 2 includes a second surface portion 2a that is in contact with the first surface portion 1a of the insulating substrate 1. In other words, out of surfaces of the metallization layer 2, a surface that is in contact with the first surface portion 1a such as the lower surface and the side surface of the insulating substrate 1 is the second surface portion 2a.

The metallization layer 2 may be a layer made in its entirety from a sintered body of a metal material including molybdenum and manganese. In addition to molybdenum and manganese, the metallization layer 2 may contain filler particles made from inorganic matter (ceramic or glass, etc.) such as for adjusting sintering behavior with the insulating substrate 1 (ceramic green sheet).

Furthermore, in the wiring base plate 10 according to the embodiment, the second surface portion 2a of the metallization layer 2 includes an oxide such as silica, manganese oxide, and magnesium oxide. The oxide described above that is incorporated in the metallization layer 2 is also incorporated in the first surface portion 1a of the insulating substrate 1 as described above. Coupling of these oxides to each other can increase strength of bonding of the metallization layer 2 to the insulating substrate 1.

To obtain such an effect, at least a total content of silica, manganese oxide, and magnesium oxide in the second surface portion 2a may be 1 to 20 mass %.

The second surface portion 2a of the metallization layer 2 and the first surface portion 1a of the insulating substrate 1 contain at least one silicate phase 3 of a manganese silicate phase and a magnesium silicate phase. The at least one silicate phase 3 of a manganese silicate phase and a magnesium silicate phase may simply be referred to as a silicate phase 3. Furthermore, an effect of the silicate phase 3 in the description below can be obtained equally either by any one of a manganese silicate phase and a magnesium silicate phase, or by both of a manganese silicate phase and a magnesium silicate phase.

Note that the insulating substrate 1 may contain a manganese silicate phase and a magnesium silicate phase in a portion other than the first surface portion 1a. Furthermore, the insulating substrate 1 may contain at least one of manganese, magnesium, and silica. In a case where, for example, an entirety of the insulating substrate 1 further contains such a component, a densification can be achieved by reducing propagation of crystallization of aluminum oxide and mullite. This can improve mechanical strength of the insulating substrate 1.

FIG. 4 is an enlarged cross-sectional view of a portion including the first surface portion 1a and the second surface portion 2a. The silicate phase 3 has an amorphous shape and the like, and an example of the silicate phase 3 is schematically illustrated in FIG. 4. In FIG. 4, the first surface portion 1a is in between a boundary line K of the insulating substrate 1 and the metallization layer 2, and an upper imaginary line (alternate long and two short dashed line), and the second surface portion 2a is in between the boundary line K of the insulating substrate 1 and the metallization layer 2, and a lower imaginary line (alternate long and two short dashed line). The silicate phase is dispersed and incorporated by a greater content in the first surface portion 1a and the second surface portion 2a than in the other portions.

In the wiring base plate 10 according to the embodiment, the silicate phases 3 incorporated in both the second surface portion 2a of the metallization layer 2 and the first surface portion 1a of the insulating substrate 1 being in contact with each other are rigidly bonded to each other at the interface between the metallization layer 2 and the insulating substrate 1. Therefore, connection reliability of the metallization layer 2 with respect to the insulating substrate 1 can be improved effectively. Furthermore, a portion where the metallization layer 2 is disposed (first surface portion 1a) includes a mullite-based sintered body having a relative permittivity smaller than a relative permittivity of an aluminum oxide-based sintered body or the like. Therefore, a transmission rate when a high frequency signal is transmitted through the metallization layer 2 can be improved.

Accordingly, bonding strength between the metallization layer 2 and the insulating substrate 1 is high, and connection reliability between the metallization layer 2 and the insulating substrate 1 is increased. When a metal member such as the metal housing 11 is bonded to the insulating substrate 1 via such a metallization layer 2, connection reliability between the metal housing 11 and the insulating substrate 1 can be increased effectively.

The silicate phase 3 is, for example, a particle having an amorphous shape as illustrated in FIG. 4, and is a polycrystalline body of manganese silicate or magnesium silicate. These silicate phase 3 particles have a surface having complex irregular curves. In this case, it is easy to increase bonding area of the silicate phase to the metallization layer 2 and the insulating substrate 1. Furthermore, bonded interfaces between the metallization layer 2 and the insulating substrate 1, and the silicate phase 3 are easily inclined (including orthogonal) with respect to a direction parallel to the interface between the metallization layer 2 and the insulating substrate 1. Therefore, an effect of reducing peeling of the metallization layer 2 due to stress acting in a direction parallel to the interface between the metallization layer 2 and the insulating substrate 1 is also relatively great.

Abundance of the silicate phase 3 in the first surface portion 1a and the second surface portion 2a may be approximately from 10 to 40 volume %, for example, as a proportion of area in observation of the cross section as illustrated in FIG. 4. This abundance can be measured by observing the bonded interface between the metallization layer 2 and the insulating substrate 1 as described above with a scanning electron microscope (SEM) or the like, and by performing elemental analysis of the silicate phase by using an XDR method.

The silicate phase 3 is not limited to a silicate phase having an amorphous shape as illustrated in FIG. 4, and may be spherical, ellipsoid, or spherical and the like having irregularity in a portion of a surface. Furthermore, a plurality of types of silicate phases 3 may be incorporated. Particle sizes of the plurality of silicate phases 3 (particles) may be different from one another, or may be approximately uniform. The particle size of the silicate phase 3 having an amorphous shape can be determined, for example, as a maximum diameter distance in a cross section.

The metallization layer 2 as described above can be formed, for example, as follows. First, the insulating substrate 1 including an aluminum oxide-based sintered body and a mullite-based sintered body is produced by the method described above. The following steps are performed assuming that the lower surface and the side surface of the insulating substrate 1 include the first surface portion 1a.

Next, a metal paste for the metallization layer 2 is applied to the lower surface and the side surface of the insulating substrate 1 in a predetermined pattern by a method such as a screen printing method. The metal paste can be produced, for example, by adding an appropriate organic solvent and binder to raw material powder including molybdenum powder and manganese powder as a main raw material, and kneading these with a mill or the like. The same material such as silica (silicon oxide), manganese oxide, molybdenum oxide, and magnesium oxide as the material added to the ceramic green sheet is added to this metal paste.

Next, the insulating substrate 1 with the metal paste applied in a predetermined pattern is subjected to firing (so-called post-firing) at a temperature of approximately 1100 to 1400° C. Thus, the metal paste and the insulating substrate 1 are bonded to each other via a glass substance such as silica. The metallization layer 2 can be formed on the insulating substrate 1 at the above-described steps.

During the firing described above, reaction between manganese oxide and magnesium oxide, and silica occurs at an interface portion between the metal paste and the insulating substrate 1, and manganese silicate and magnesium silicate are produced. For example, when no magnesium is added to the metal paste, only manganese oxide is produced on the metal paste side. Again in this case, when the insulating substrate 1 contains magnesium oxide (when added), magnesium oxide can also be produced at a bonded interface portion between the metallization layer 2 and the insulating substrate 1.

Note that, the example illustrated in FIGS. 1A and 1B illustrate a state in which a metal member is bonded to the metallization layer 2 being in contact with the first surface portion 1a on the lower surface of the insulating substrate 1. This metal member is a portion of the metal housing 11 provided in the electronic device package 20 described below, and is a bottom portion 11A of the metal housing 11. This detail will be described below. Furthermore, in this example, the metallization layer 2 and the metal housing 11 are bonded via a brazing material 4. The brazing material 4 is, for example, silver solder (such as JIS standard BAg8).

Electronic Device Package

As described above, the electronic device package 20 according to an embodiment is formed of the wiring base plate 10 according to the embodiment and the metal housing 11 including a recessed portion 12. The insulating substrate 1 is bonded to an inner surface of the recessed portion 12 of the metal housing 11 via the metallization layer 2.

In the example of this embodiment, for example as illustrated in FIG. 2, the metal housing 11 is formed by bonding the bottom portion 11A that is a metal flat plate member, and a frame 11B that is a metal frame member. A region surrounded by an upper surface of the bottom portion 11A and an inner side surface of the frame 11B constitutes a portion of a container for housing the wiring base plate 10 and the electronic component 21.

Note that the bottom portion and the frame portion of the metal housing 11 may be formed integrally (not illustrated). Since there is no bonded interface between the bottom portion 11A and the frame 11B in the metal housing formed integrally, this is advantageous in increasing air tightness in hermetically sealing the inside of the recessed portion 12. Furthermore, since the step of bonding the bottom portion 11A and the frame 11B is unnecessary, this is advantageous in improving productivity of the electronic device package 20.

For example, the metal housing 11 is formed of a metal material such as copper, an alloy material including copper, an iron-nickel alloy, an iron-nickel-cobalt alloy, or a stainless steel. The metal housing 11 can be fabricated by appropriately selecting and applying metal processing such as rolling, cutting, polishing, grinding, and etching to the metal material as described above. Furthermore, the bottom portion 11A and the frame 11B can be bonded to each other by various bonding methods such as bonding via a brazing material such as silver solder or the like.

Furthermore, in the example of this embodiment, portions of the frame 11B are provided with through portions 13A, 13B penetrating the inside and the outside (from an inner side surface to an outer side surface) of the frame. The through portions 13A, 13B function as openings for passing a connecting member for electrical connection, optical connection, or the like between the inside and the outside of the recessed portion 12. In the example illustrated in FIG. 2, a portion of the wiring base plate 10 protrudes outward from the inside of the recessed portion 12 via the through portion 13A provided in a portion of the frame 11. Electrical connection can be made between the electronic component 21 and an external electrical circuit via the metallization layer 2 located in this protruded portion (with no reference sign).

The through portion 13B provided in another portion of the frame 11B can function as a portion where an optical connection member (not illustrated) such as an optical waveguide is disposed. In this case, the optical waveguide is disposed to penetrate the frame 11B in the through portion 13B. Optical connection between an electronic component and an external optical device (not illustrated) can be made via the optical waveguide.

In the example illustrated in FIG. 2, the lower surface and the side surface of the insulating substrate 1 include the first surface portion 1a that the metallization layer 2 is in contact with. The lower surface of the insulating substrate 1 is bonded to a bottom surface of the recessed portion 12 via the metallization layer 2. Furthermore, the side surface of the insulating substrate 1 is bonded to each of two inner side surfaces on the long side of the recessed portion 12 having a rectangular shape in a plan view.

According to such an electronic device package 20, since the wiring base plate 10 including the configuration described above is provided, bonding strength between the metal housing 11 and the insulating substrate 1 via the metallization layer 2 is high. Therefore, the electronic device package 20 that can easily fabricate the electronic device 30 with high long-term reliability can be provided.

Electronic Device

As described above, the electronic device 30 according to an embodiment is formed, for example, of the electronic component 21 being housed in the recessed portion 12 of the electronic device package 20 including the configuration described above. The electronic component 21 is electrically connected to the metallization layer 2 via a conductive connection material such as, for example, a bonding wire 22. Furthermore, in the example illustrated in FIG. 3, a lid 23 is bonded to an upper surface of the frame 11B of the metal housing 11 to cover the recessed portion 12. Thus, a container (with no reference sign) that hermetically seals the electronic component 21 by the recessed portion 12 of the metal housing 11 and the lid 23 is configured.

The lid 23 has, for example, a flat plate shape that is rectangular in a plan view, and is made from a material including a metal material similar to the metal material of the metal housing 11. A metal material similar to the metal material of the metal housing 11 may be used and metal processing similar to the metal processing of the metal housing 11 may be performed for producing the lid 23. The lid 23 can be bonded to the upper surface of the frame 11B of the metal housing 11 by various bonding methods such as, for example, a bonding method using a low melting point brazing material, a welding method or the like.

According to such an electronic device 30, since the wiring base plate 10 including the configuration described above is provided, bonding strength between the metal housing 11 and the insulating substrate 1 via the metallization layer 2 is high. Accordingly, the electronic device 30 having high long-term reliability can be achieved.

The electronic component 21 may be mounted in the metal housing 11 (the upper surface of the bottom portion 11A) via a mount 24. The mount 24 is disposed, for example, to reduce thermal stress by mitigating a difference in a coefficient of thermal expansion between the electronic component 21 and the metal housing 11.

In the wiring base plate 10 according to the embodiment and the electronic device package 20 including the same, and the electronic device 30, as described above, the metallization layer 2 contains an additive including at least one of a manganese compound and a molybdenum compound, and including silica. A manganese compound and a molybdenum compound are also incorporated in the second surface portion 2a of the metallization layer 2. Furthermore, in the wiring base plate 10 according to the embodiment and the electronic device package 20 including the same, and the electronic device 30, the insulating substrate 1 may also include an additive including at least one of a manganese compound and a molybdenum compound, and including silica. Hereinafter, the additive including at least one of a manganese compound and a molybdenum compound, and including silica is simply referred to as an additive.

In such a case, content of the additive in the insulating substrate 1 and the metallization layer 2 may be greater in the first surface portion 1a than that in other portions of the insulating substrate 1. Furthermore, the content of the additive may be greater in the second surface portion 2a than that in other portions of the metallization layer 2.

When the content of the additive is greater in the first surface portion 1a than that in other portions of the insulating substrate 1, and greater in the second surface portion 2a than that in other portions of the metallization layer 2, strength of coupling of the same types of additives to each other at an interface between the first surface portion 1a and the second surface portion 2a can be increased effectively. Accordingly, strength of bonding between the metallization layer 2 and the insulating substrate 1 via the first surface portion 1a and the second surface portion 2a can be increased.

Furthermore, in such a case, since the content of the additive in the metallization layer 2 is relatively small in portions other than the second surface portion 2a, there is an advantage of improved electrical properties such as reduced conduction resistance of the metallization layer 2. Furthermore, since the content of the additive in the insulating substrate 1 is relatively small in portions other than the first surface portion 1a, there is an advantage of ensuring electrical insulation and mechanical strength, and the like of the insulating substrate 1.

In a case where the content of the additive is greater in the first surface portion 1a than that in other portions of the insulating substrate 1, and the content of the additive is greater in the second surface portion 2a than that in other portions of the metallization layer 2, the content of the additive in each portion will be set, for example, as follows. That is, the content of the additive such as a manganese compound and a molybdenum compound in the first surface portion 1a of the insulating substrate 1 is, for example, approximately 1 to 20 mass %, and the content of the additive in other portions is approximately 5 mass % or less, and is a value smaller than in the first surface portion. Furthermore, the content of the additive such as a manganese compound and a molybdenum compound in the second surface portion 2a of the metallization layer 2 is, for example, approximately 1 to 20 mass %, and the content of the additive in other portions is approximately 5 mass % or less. Manganese or the like may be present in other portions of the metallization layer 2, as long as manganese or the like is in a state other than a compound such as an oxide.

Examples of the additive other than silica and other than a manganese compound and a molybdenum compound include an oxide such as magnesium, aluminum, silicon, and zirconium oxides. When an oxide of magnesium is incorporated as the additive, a magnesium silicate can be produced by reaction of a magnesium compound and silica. This magnesium silicate can function as a portion of the silicate phase 3 described above. Thus, strength of bonding between the metallization layer 2 and the insulating substrate 1 can also be increased.

The content of any one of a manganese compound and a molybdenum compound, and the content of silica in the insulating substrate 1 and the metallization layer 2 including the first surface portion 1a and the second surface portion 2a can be measured by instrumental analysis such as elemental analysis or the like described above. In this case, a cross-sectional sample is produced by cutting the bonded interface portion between the insulating substrate 1 and the metallization layer 2 in a thickness direction. Abundance of each element (Mo, Mn, Si, etc.) can be detected by observing this cross section by using SEM and performing elemental analysis. The content of each compound can be measured based on the result.

Note that, in each of the examples described above, the molybdenum compound may be molybdenum oxide. Furthermore, the manganese compound may be manganese oxide. The additive may be an additive that includes molybdenum oxide and manganese oxide. In other words, the additive may be an additive composed of silica (silicon oxide) and an oxide of at least one of molybdenum and manganese.

In this case, since an insulating substrate in which the first surface portion of the insulating substrate 1 includes the aluminum oxide and the mullite-based sintered body is of an oxide, strength of bonding between the additive including an oxide and the insulating substrate 1 can be increased. Therefore, strength of bonding between the insulating substrate 1 and the metallization layer 2 can be improved effectively in conjunction with an effect of effectively increasing strength of coupling of the same types of additives to each other at the interface between the first surface portion 1a and the second surface portion 2a. Accordingly, the wiring base plate 10 effective for improving reliability of the electronic device 30 can be achieved. Furthermore, the electronic device package 20 enabling such an electronic device 30 to be easily fabricated can be achieved. Furthermore, the electronic device 30 advantageous in improving reliability can be achieved. Furthermore, as with each example described above, the wiring base plate 10, the electronic device package 20, and the electronic device 30 are also effective for improving a transmission rate of a high frequency signal.

Furthermore, when molybdenum oxide is added as described above, the molybdenum oxide functions as a pigment, and the insulating substrate 1 is colored a dark color such as dark brown. Thus, reflection of light on the surface of the insulating substrate 1 is reduced. Therefore, when the electronic component 21 is, for example, a photoelectric conversion element, irregular reflection of light in the recessed portion 12 is reduced, and propagation efficiency of a signal is increased.

Furthermore, in the wiring base plate 10, the electronic device package 20, and the electronic device 30 of each example described above, the insulating substrate 1 may further contain at least one of a manganese aluminate phase and a magnesium aluminate phase. In the following, the manganese aluminate phase and the magnesium aluminate phase may be referred to as an aluminate phase without particular distinction. When the insulating substrate 1 contains the aluminate phase, propagation of alumina (aluminum oxide) and mullite crystallization in the insulating substrate 1 is reduced. Therefore, a crystal grain size of these crystals can be made more uniform and smaller. Therefore, a dielectric dissipation factor (so-called tan δ) of the wiring base plate 1 can be reduced.

In this case, when the aluminate phase is present in the first surface portion 1a of the insulating substrate 1, the effect of reducing the dielectric dissipation factor can be obtained effectively. The aluminate phase may also be incorporated inside of the insulating substrate 1 other than in the first surface portion 1a, but a presence of the aluminate phase at least in the first surface portion 1a enables the above-described effect to be effectively obtained.

The manganese aluminate phase and the magnesium aluminate phase are produced from, for example, a manganese component (such as a manganese silicate phase) and a magnesium component (such as a magnesium silicate phase) incorporated in the first surface portion 1a, and an aluminum oxide component (such as aluminum oxide) of the insulating substrate 1. That is, the wiring base plate 1 is subjected to heat treatment, and thus, at least one of the manganese component and the magnesium component, and the aluminum oxide can be coupled to produce and precipitate the aluminate phase.

Note that the aluminate phase may also be incorporated in the second surface portion 2a of the metallization layer 2. For example, the aluminate phase produced as described above can also be diffused to and incorporated in the second surface portion 2a that is in contact with the first surface portion 1a. When the aluminate phase is also incorporated in the second surface portion 2a, the effect of reducing the dielectric dissipation factor as described above can be increased. In the wiring base plate 10 according to the embodiment, the lower surface and the side surface of the insulating substrate 1 include the first surface portion 1a. Furthermore, the metallization layer 2 is positioned on the lower surface and the side surface of the insulating substrate 1. According to the wiring base plate 10 in such a form, both the lower surface and the side surface of the insulating substrate 1 can be bonded to the inner surface of the recessed portion 12 of the metal housing 11 via the metallization layer 2. The inner surface of this recessed portion 12 is a surface of the bottom portion 11A and the frame 11B, and corresponds to the bottom surface and the inner side surface of the recessed portion 12. Therefore, strength of bonding of the insulating substrate 1 (wiring base plate 10) with respect to the metal housing 11 can be improved effectively. In the above-described bonding, the same type of the brazing material 4 can be used for both the lower surface and the side surface of the insulating substrate 1.

In the electronic device package 20 and the electronic device 30 including the same, when the wiring base plate 10 according to the above-described form is provided, the lower surface and the side surface of the insulating substrate 1 are bonded to the bottom surface and the inner side surface of the recessed portion 12 of the metal housing 11 via the metallization layer 2. Strength of bonding between the insulating substrate 1 and the metal housing 11 is effectively improved in such an electronic device package 20 and the electronic device 30 including the same. Accordingly, for example, the electronic device package 20 and the electronic device 30 that are advantageous in improving reliability of electrical and optical connection with an external electrical circuit or the like via the wiring base plate 10 may be achieved.

Note that in the wiring base plate 10, the electronic device package 20, and the electronic device 30 according to the embodiment, only the lower surface or the side surface of the insulating substrate 1 may have the first surface portion 1a to which the metallization layer 2 is bonded. In this case, the number of steps of providing the metallization layer 2 in the insulating substrate 1 is reduced. Therefore, this is advantageous from the perspective of productivity and economics of the wiring base plate 10 and the electronic device package 20 including the same and the electronic device 30.

Figure 5:
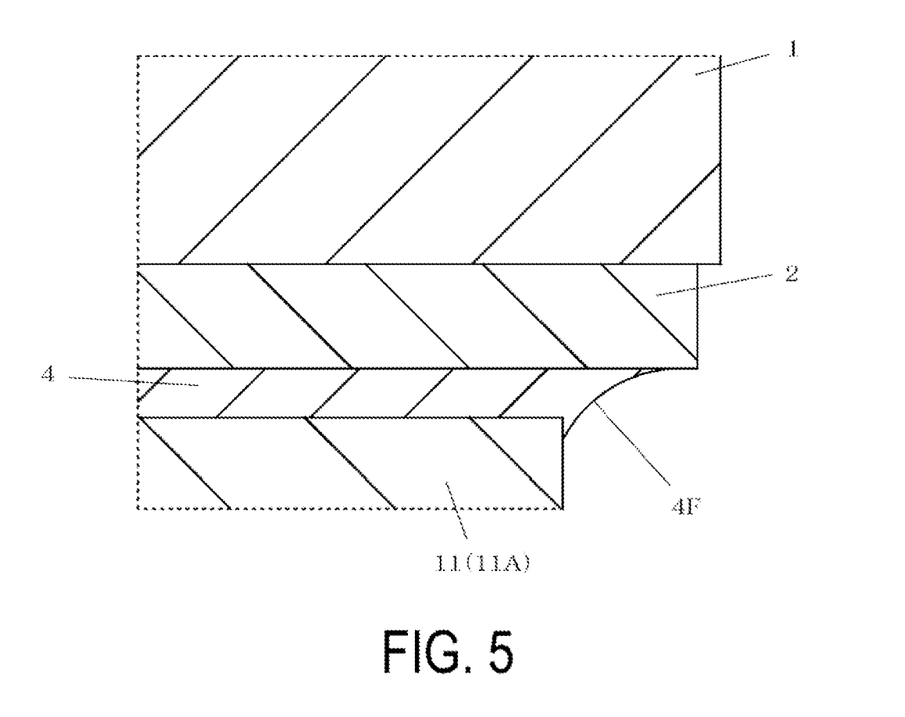
FIG. 5 is an enlarged cross-sectional view illustrating part C of FIG. 2.

Furthermore, in the electronic device package 20 and the electronic device 30 including the wiring base plate 10 according to the embodiment, for example, as illustrated in FIG. 5, the brazing material 4 may include a fillet 4F in a bonding structure of the metallization layer 2 (including the other metallization layer 2L) and the metal housing 11. When a fillet 4F portion is present in the brazing material 4, strength of bonding between the brazing material 4 and the metal housing 11 can be increased. Namely, strength of bonding between the metal housing 11, the metallization layer 2, and the insulating substrate 1 via the brazing material 4 can be increased. Furthermore, thermal stress generated due to a difference in a coefficient of thermal expansion between the insulating substrate 1 and the metal housing 11 in a brazing material 4 portion can be mitigated in the fillet 4F portion.

Thus, reliability of bonding between the insulating substrate 1 and the metal housing 11 can be increased effectively. Accordingly, the electronic device package 20 and the electronic device 30 that are advantageous in improving reliability such as reliability of sealing of the electronic component 21 can be achieved.

Note that such a fillet 4F is not limited to being present in the bottom portion 11A of the metal housing 11 and may be present in the frame 11B of the metal housing 11. Again in this case, the electronic device package 20 and the electronic device 30 effective for improving reliability of bonding between the insulating substrate 1 and the metal housing 11, namely, reliability of hermetic sealing of the electronic component 21, and the like can be achieved.

Furthermore, in the case where the brazing material 4 includes the fillet 4F in the frame 11B, for example, even when thermal stress is applied to the brazing material 4 due to heat generated at the time of bonding the lid 23 to the upper surface of the metal housing 11 (frame 11B), reliability of bonding between the lid 23 and the frame 11B can be increased effectively.

Such a fillet 4F can be provided in the brazing material 4 by adjusting conditions such as, for example, an amount (volume) of the brazing material 4, a brazing temperature, surface roughness of the metal housing 11 and the metallization layer 2 surface in a brazed portion. For example, when the amount of the brazing material 4 is increased, the fillet 4F extends outwardly from the brazed portion. In this case, when the amount of the brazing material 4 is too large, a flared portion of the brazing material does not form a fillet shape on a smooth concave surface, but becomes a clump (so-called lump shape) of an amorphous shape, and thus, there is a possibility of reducing the effect of mitigating thermal stress. In other words, the fillet 4 that includes a smooth concave outer surface and is in contact with the metal housing 11 and the metallization layer 2 (2L) at a small wetting angle is advantageous in improving reliability such as hermetic sealing.

Note that the present invention is not limited to the examples of the above-described embodiments and, various modifications can be made without departing from the scope of the present invention. For example, a width of the frame 11B that is a portion of the metal housing 11 to which the lid 23 is bonded may be made smaller in an upper surface portion to which the lid 23 is bonded than other portions. In other words, a stepped portion (notch portion) may be provided in an outer side surface or an inner side surface near the upper surface of the frame 11B. In this case, reliability of hermetic sealing, and the like can be improved by increasing the effect of mitigating thermal stress due to deformation of the frame 11B at the time of bonding the lid 23.

REFERENCE SIGNS LIST

1 Insulating substrate
1a First surface portion
2 Metallization layer
2a Second surface portion
2L Other metallization layer
3 Silicate phase
4 Brazing material
4F Fillet
10 Wiring base plate
11 Metal housing
11A Bottom portion
11B Frame
12 Recessed portion
13A, 13B Through portion
14b Second connection point
20 Electronic device package
21 Electronic component
22 Bonding wire
23 Lid
24 Mount
30 Electronic device

The invention claimed is:

1. A wiring base plate comprising:
an insulating substrate including a first surface portion containing an aluminum oxide-based sintered body and a mullite-based sintered body; and
a metallization layer including a second surface portion, the second surface portion containing at least one of a manganese compound and a molybdenum compound and being in contact with the first surface portion of the insulating substrate;
wherein the second surface portion of the metallization layer and the first surface portion of the insulating substrate contain at least one of a manganese silicate phase and a magnesium silicate phase.

2. The wiring base plate according to claim 1, wherein the insulating substrate and the metallization layer contain an additive including at least one of a manganese compound and a molybdenum compound, and including silica; and
content of the additive in the insulating substrate and the metallization layer is greater in the first surface portion than that in other portions of the insulating substrate, and is greater in the second surface portion than that in other portions of the metallization layer.

3. The wiring base plate according to claim 2, wherein the molybdenum compound is molybdenum oxide.

4. The wiring base plate according to claim 1, wherein the insulating substrate further contains at least one of a manganese aluminate phase and a magnesium aluminate phase.

5. The wiring base plate according to claim 1, wherein a lower surface and a side surface of the insulating substrate include the first surface portion, and the metallization layer is located on the lower surface and the side surface of the insulating substrate.

6. An electronic device package comprising:
the wiring base plate according to claim 5; and
a metal housing including a recessed portion;
wherein the insulating substrate is bonded to an inner surface of a recessed portion of the metal housing via the metallization layer.

7. The electronic device package according to claim 6, wherein a lower surface and a side surface of the insulating substrate are bonded to a bottom surface and an inner side surface of a recessed portion of the metal housing via the metallization layer.

8. An electronic device comprising the electronic device package according to claim 6 and an electronic component housed within a recessed portion of the metal housing.

9. An electronic device package comprising:
the wiring base plate according to claim 1; and
a metal housing including a recessed portion;
wherein the insulating substrate is bonded to an inner surface of a recessed portion of the metal housing via the metallization layer.

10. An electronic device comprising:
the electronic device package according to claim 9, and
an electronic component housed within a recessed portion of the metal housing.

11. The wiring base plate according to claim 1, wherein the insulating substrate contains an additive including at least one of a manganese compound and a molybdenum compound, and including silica; and
a content of the additive in the insulating substrate is greater in the first surface portion than that in other portions of the insulating substrate.

12. The wiring base plate according to claim 1, wherein the metallization layer contains an additive including at least one of a manganese compound and a molybdenum compound, and including silica; and
content of the additive in the metallization layer is greater in the second surface portion than that in other portions of the metallization layer.

13. The wiring base plate according to claim 1, wherein the insulating substrate comprises a lower surface including the first surface portion; and
the metallization layer is located on the lower surface of the insulating substrate.

14. The wiring base plate according to claim 1, wherein the at least one of a manganese silicate phase and a magnesium silicate phase comprises a particle having a surface with complex irregular curves.

* * * * *